(12) United States Patent
Wang et al.

(10) Patent No.: US 7,494,601 B2
(45) Date of Patent: Feb. 24, 2009

(54) PIEZOELECTRIC CERAMIC COMPOSITION AND THE METHOD FOR PREPARING THE SAME

(75) Inventors: Xiaoxing Wang, Hung Hom Kowloon (HK); Kin Wing Kwok, Hung Hom Kowloon (HK); Helen Lai Wah Chan, Hung Hom Kowloon (HK); Siu Hong Choy, Hung Hom Kowloon (HK)

(73) Assignee: The Hong Kong Polytechnic University, Hung Hom Kowloon (HK)

( * ) Notice: Subject to any disclaimer, the term of this patent is extended or adjusted under 35 U.S.C. 154(b) by 291 days.

(21) Appl. No.: 11/362,793

(22) Filed: Feb. 28, 2006

(65) Prior Publication Data

US 2007/0200084 A1   Aug. 30, 2007

(51) Int. Cl.
*C04B 35/495* (2006.01)
*H01L 41/187* (2006.01)

(52) U.S. Cl. .................. 252/62.9 R; 501/134
(58) Field of Classification Search ............ 252/62.9 R; 501/134
See application file for complete search history.

(56) References Cited

U.S. PATENT DOCUMENTS 6,093,339 A   7/2000   Kimura et al.

2004/0058797 A1* 3/2004 Nonoyama et al. .......... 501/134

FOREIGN PATENT DOCUMENTS

| JP | 2004244301 | 9/2004 |
|----|------------|--------|
| JP | 2004244302 | 9/2004 |

* cited by examiner

*Primary Examiner*—C. Melissa Koslow
(74) *Attorney, Agent, or Firm*—Dickinson Wright, PLLC; John M. Naber

(57) ABSTRACT

The present invention provides a piezoelectric ceramic composition, especially a lead-free piezoelectric ceramic composition, with a suitable amount of $CeO_2$ or $CeO_2$-containing complex additives, which is represented by the following formula:
$(Na_{0.475}K_{0.475}Li_{0.05})(Nb_{1-x}A_x)O_3 + yCeO_2 + zBO_2$ wherein "A" represents Sb or Sb+Ta, "B" represents a tetravalent transition metal, $0 \leq x \leq 0.2$, $0.2$ wt%$< y <1.2$ wt% and $0 \leq z 1$ wt%. Addition of $CeO_2$ or $CeO_2$-containing complex additives suppresses melting and abnormal grain growth of $(Na_{0.475}K_{0.475}Li_{0.05})(Nb_{1-x}A_x)O_3$ during sintering, thereby improving sinterability and increasing the density of the composition. As a result, the dielectric and piezoelectric properties of the ceramics are enhanced. Furthermore, the represented compositions have a wide sintering temperature range so that the process for preparing such a lead-free piezoelectric ceramic composition has high degree efficiency.

9 Claims, 2 Drawing Sheets

PIEZOELECTRIC CERAMIC COMPOSITION AND THE METHOD FOR PREPARING THE SAME

BACKGROUND OF THE INVENTION

1. Field of the Invention

The present invention relates to a piezoelectric ceramic composition, and particularly to a lead-free piezoelectric ceramic composition with a suitable amount of $CeO_2$ or $CeO_2$-containing complex additives. Also, the present invention relates to a method for preparing the same.

2. Background Art

In the past, as a piezoelectric ceramic composition, a $Pb(Zr,Ti)O_3$ (PZT) component-based ceramic containing lead has been used as the most important piezoelectric compound. This is because the above PZT exhibits large piezoelectric properties and has a high mechanical quality factor superior in long-term stability and enables the easy fabrication of materials of various properties required for applications such as sensors, actuators, and filters. Further, PZT has a high relative dielectric constant, so can also be used as a capacitor, etc.

While a piezoelectric ceramic composition comprised of PZT has superior properties, it includes lead among its component elements, so harmful lead such as volatile and harmful lead oxide leaches out from the industrial waste of products containing the PZT, and therefore manufacture and disposal of devices using it will cause severe environmental pollution problem. The rising awareness of such environmental issues in recent years has made difficult the production of products that might become causes of environmental pollution such as with PZT. Therefore, development of a piezoelectric ceramic composition containing no lead is desirable.

In general, lead-free piezoelectric ceramics can be mainly divided into three types in terms of their structures: perovskite, tungsten bronze and bismuth layer. The lead-free piezoelectric ceramics in tungsten or bismuth layer structure are featured with high Curie temperature and are especially suitable for high temperature applications. In perovskite type lead-free piezoelectric ceramics, $(Bi_{1/2}Na_{1/2})TiO_3$-based ceramics (BNT) with rhombohedral perovskite structure are considered to be good candidates to replace PZT ceramics because of its strong ferroelectricity. However, as comparing with PZT ceramics, BNT ceramics have low piezoelectric properties and low depolarization temperature. In contrast, $(Na,K)NbO_3$ (NKN)-based ceramics exhibit high Curie temperatures, large electromechanical properties and low densities, showing attractive potential for replacing PZT ceramics in some practical use.

Although $(K,Na)NbO_3$-based ceramics have comparatively excellent piezoelectric properties, they are hard to sinter. As a result, it is featured with high dielectric loss, narrow sintering temperature range and poor reproducibility. Practically, a hot pressing technique is required to form a highly dense structure of $(K,Na)NbO_3$ so as to give excellent piezoelectric properties, which results in high cost and low efficiency in manufacture of the desired devices. The poor sinterability of $(K, Na)NbO_3$ is due to the volatility of alkali metal components (K, Na) and a low melting point of $KnbO_3$, which tend to cause abnormal growth of grains and make it difficult to increase the sintering temperature to a level high enough to assure high densification of the structure.

As a result, studies are made to improve the sinterability of $(K,Na)NbO_3$-based ceramics. For example, in JP2004-244301 and JP2004-244302, it is described that the substitution of Nb by Sb and Sb+Ta in the form of a solid solution improves its sinterability. However, these compositions show narrow sintering temperature range and poor reproducibility, which is crucial for practical use. Furthermore, their piezoelectric and dielectric properties need to be improved.

SUMMARY OF THE INVENTION

The present invention has been achieved in an attempt to solve the above mentioned problems with piezoelectric ceramic compositions based on $(K,Na)NbO_3$ Accordingly, an object of the present invention is to provide a lead-free piezoelectric ceramic composition with a suitable amount of $CeO_2$ or $CeO_2$ complex additives, which shows good piezoelectric and dielectric properties as well as good reproducibility.

The present invention provides a piezoelectric ceramic composition represented by the following formula:

$$(Na_{0.475}K_{0.475}Li_{0.05})(Nb_{1-x}A_x)O_3 + yCeO_2 + zBO_2$$

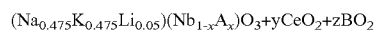

wherein "A" represents Sb or Sb+Ta, "B" represents a tetravalent transition metal, $0 \leq x \leq 0.2$, $0.2\ wt\% < y < 1.2\ wt\%$, and $0 \leq z < 1\ wt\%$, the weight percentage y and z are calculated based on the weight of said compound $(Na_{0.475}K_{0.475}Li_{0.05})(Nb_{1-x}A_x)O_3$.

Addition of $CeO_2$ or $CeO_2$-containing complex additives suppresses melting and abnormal grain growth of $(Na_{0.475}K_{0.475}Li_{0.05})(Nb_{1-x}A_x)O_3$ during sintering, thereby improving sinterability and increasing the density of the composition. As a result, the dielectric and piezoelectric properties of the ceramics are enhanced.

The present invention also provides a method for preparing the above piezoelectric ceramic composition, comprising the steps of adding an additive containing Ce and optional B into the compound of general formula $(Na_{0.475}K_{0.475}Li_{0.05})(Nb_{1-x}A_x)O_3$ by the weight percentages giving, and sintering the result to form the composition of formula $(Na_{0.475}K_{0.475}Li_{0.05})(Nb_{1-x}A_x)O_3 + yCeO_2 + zBO_2$, wherein "A" represents Sb or Sb+Ta, "B" represents a tetravalent transition metal, $0 \leq x \leq 0.2$, $0.2\ wt\% < y < 1.2\ wt\%$, and $0 \leq z < 1\ wt\%$, and the weight percentage y and z are calculated based on the weight of said compound $(Na_{0.475}K_{0.475}Li_{0.05})(Nb_{1-x}A_x)O_3$.

Since the composition according to the present invention are simply prepared by sintering a first starting material in the form of a perovskite compound represented by a formula $(Na_{0.475}K_{0.475}Li_{0.05})(Nb_{1-x}A_x)O_3$ and a second starting material serving as a source of the additives $yCeO_2$ or $yCeO_2 + zB$, this process has high degree efficiency for preparing such a lead-free piezoelectric ceramic composition. The process does not require any special forming and sintering techniques such as the hot pressing technique.

Because of the improved sinterability and enhanced piezoelectric properties, the present invention can readily be used by industries to replace lead-containing piezoelectric ceramics in various applications such as piezoelectric actuators and sensors. Piezoelectric ceramics are being widely used in various fields as a material for filters, actuators, transducers and any other devices capable of producing an electric signal subjected to a mechanical excitation or a mechanical motion subjected to an electric excitation.

BRIEF DESCRIPTION OF THE DRAWINGS

The foregoing features as well as other features will become apparent with reference to the description and figures below in which like numerals represent like elements and in which.

DETAILED DESCRIPTION OF THE PREFERRED EMBODIMENTS

Figure 1:
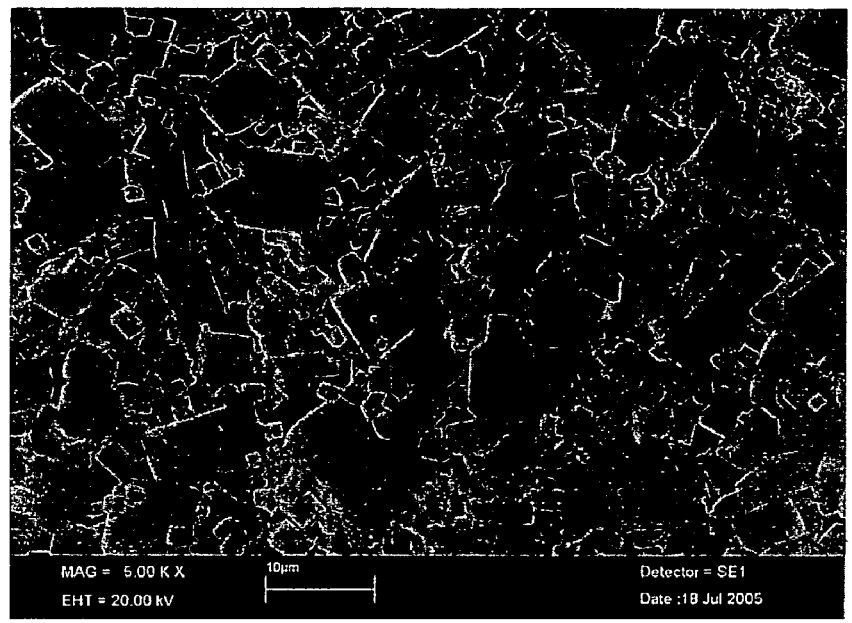
FIG. 1 is a SEM micrograph of the cross section of Sample 1 (prior art)

As described above, one aspect of the present invention provide a piezoelectric ceramic composition, which is represented by the following formula:

$$(Na_{0.475}K_{0.475}Li_{0.05})(Nb_{1-x}A_x)O_3+yCeO_2+zBO_2$$

wherein "A" can represent Sb or Sb+Ta, "B" can represent a tetravalent transition metal, $0 \leq x \leq 0.2$, 0.2 wt %<y<1.2 wt %, and $0 \leq z \leq 1$ wt %, said weight percentage y and z can be calculated based on the weight of said compound $(Na_{0.475}K_{0.475}Li_{0.05})(Nb_{1-x}A_x)O_3$.

"x" can be defined as $0 \leq x \leq 0.2$ since the piezoelectric ceramic composition according to the present invention may or may not comprise Sb or Sb+Ta. And when Sb or Sb+Ta, is present, the suitable range of x is $0<x \leq 0.2$, because more addition of Sb or Sb+Ta leads to a deterioration in piezoelectric and dielectric properties.

"y" can be defined as 0.2 wt %<y<1.2 wt %. If y falls outside this range, the sintered products are unsatisfactory. When $y \leq 0.2$ wt %, addition of $CeO_2$ has no significant effect on the sinterability. On the other hand, when $y \geq 1.2$ wt %, there is significant decrease in both the dielectric and piezoelectric properties.

"z" can be defined as $0 \leq z < 1$ wt %, since the piezoelectric ceramic composition according to the present invention may comprise or may not comprise a complex additive consisting of $CeO_2$ and $BO_2$. When such a complex additive is presented, the suitable range for "z" is 0<z<1 wt %, because addition of BO2 more than 1 wt % is not favorable for improvement of piezoelectric properties.

Preferably, "B" is at least one element selected from the group consisting of Mn, Ti and Zr.

Further, the range of y and z preferably meet the relational expression of 0.2 wt %<y+z≦2.0 wt %. Especially, y is preferable to fall into the range of 0.4 wt %≦y≦0.8 wt %. Alternatively or additionally, x and y meet the relational expressions of 0<x≦0.08 and 0≦z≦0.6 wt % respectively. More preferably, 0.4 wt %≦z≦0.6 wt %.

In one embodiment of this invention, "A" is not in existence (x=0), and the piezoelectric composition is represented by a formula $(Na_{0.475}K_{0.475}Li_{0.05})NbO_3+yCeO_2+zBO_2$. In this case, addition of $CeO_2$ or $CeO_2+BO_2$ leads to an increase in sintering temperature and a decrease in grain size, and improves the piezoelectric properties of $(Na_{0.475}K_{0.475}Li_{0.05})NbO_3$ ceramics. And the preferred range of "y" is 0.4 wt %≦y≦0.8 wt %. Illustrative examples of such composition include $(Na_{0.475}K_{0.475}Li_{0.05})NbO_3+0.4$ wt % $CeO_2$; $(Na_{0.475}K_{0.475}Li_{0.05})NbO_3+0.6$ wt % $CeO_2$; $(Na_{0.475}K_{0.475}Li_{0.05})NbO_3+0.8$ wt % $CeO_2$; and the like. To improve both dielectric and piezoelectric properties, a longer soaking time is recommended. However, the temperature range for well-sintered $CeO_2$-added $(Na_{0.475}K_{0.475}Li_{0.05})NbO_3$ composition is still narrow, and its dielectric properties are not optimal, although it is still superior to the traditional piezoelectric compound $(Na_{0.475}K_{0.475}Li_{0.05})NbO_3$.

So, in a preferred embodiment of this invention, "A" is present (i.e. x≠0), but "B" is not present (i.e. z=0), and the piezoelectric composition is represented by a formula $(Na_{0.475}K_{0.475}Li_{0.05})(Nb_{1-x}A_x)O_3+yCeO_2$. In this case, the dielectric and piezoelectric properties of such composition are superior to those without addition of additives, i.e. $(Na_{0.475}K_{0.475}Li_{0.05})(Nb_{1-x}A_x)O_3$ ("A" represents Sb or Sb+Ta). This clearly shows the effects of $CeO_2$ to improve dielectric and piezoelectric properties of the composition. The preferred range of y is 0.4 wt %≦y≦0.8 wt %, and the preferred range of x is 0<x≦0.08. Examples of such composition include $(Na_{0.475}K_{0.475}Li_{0.05})(Nb_{0.99}Sb_{0.01})O_3+0.4$ wt % $CeO_2$;
$(Na_{0.475}K_{0.475}Li_{0.05})(Nb_{0.99}Sb_{0.01})O_3+0.8$ wt % $CeO_2$;
$(Na_{0.475}K_{0.475})Li_{0.05})(Nb_{0.97}Sb_{0.03})O_3+0.4$ wt % $CeO_2$;
$(Na_{0.475}K_{0.475}Li_{0.05})(Nb_{0.97}Sb_{0.03})O_3+0.8$ wt % $CeO_2$;
$(Na_{0.475}K_{0.475}Li_{0.05})(Nb_{0.92}Ta_{0.05}Sb_{0.03})O_3+0.4$ wt % $CeO_2$;
and the like.

In a further preferred embodiment of this invention, both "A" and "B" are in existence (x≠0, z≠0), and the piezoelectric composition is represented by a formula $(Na_{0.475}K_{0.475}Li_{0.05})(Nb_{1-x}A_x)O_3+yCeO_2+zBO_2$. In this case, such compositions have dielectric and piezoelectric properties superior not only to $(Na_{0.475}K_{0.475}Li_{0.05})(Nb_{1-x}A_x)O_3$ but also to $(Na_{0.475}K_{0.475}Li_{0.05})(Nb_{1-x}A_x)O_3+yCeO_2$ ("A" represents Sb or Sb+Ta). This indicates that the $CeO_2$-containing complex additives are more effective in improving the sinterability and dielectric and piezoelectric properties of the composition than the $CeO_2$ additive. The preferred y and z meet the relational expression of 0.2 wt %<y+z≦2.0 wt %. More preferably, the range of y is 0.4 wt %≦y≦0.8 wt %, the preferred range of x is 0<x≦0.08, and the preferred range of z is 0<z≦0.6 wt %. Examples of such composition include $(Na_{0.475}K_{0.475}Li_{0.05})(Nb_{0.97}Sb_{0.03})O_3+0.4$ wt % $CeO_2+0.4$ wt % $MnO_2$;
$(Na_{0.475}K_{0.475}Li_{0.05})(Nb_{0.97}Sb_{0.03})O_3+0.6$ wt % $CeO_2+0.6$ wt % $MnO_2$;
$(Na_{0.475}K_{0.475}Li_{0.05})(Nb_{0.97}Sb_{0.03})O_3+0.4$ wt % $CeO_2+0.4$ wt % $TiO_2$;
$(Na_{0.475}K_{0.475}Li_{0.05})(Nb_{0.97}Sb_{0.03}O_3)O_3+0.6$ wt % $CeO_2+0.6$ wt % $TiO_2$;
$(Na_{0.475}K_{0.475}Li_{0.05})(Nb_{0.97}Sb_{0.03})O_3+0.4$ wt % $CeO_2+0.4$ wt % $ZrO_2$;
$(Na_{0.475}K_{0.475}Li_{0.05})(Nb_{0.97}Sb_{0.03})O_3+0.6$ wt % $CeO_2+0.6$ wt % $ZrO_2$;
$(Na_{0.475}K_{0.475}Li_{0.05})(Nb_{0.92}Ta_{0.05}Sb_{0.03})O_3+0.4$ wt % $CeO_2+0.4$ wt % $MnO_2$;
$(Na_{0.475}K_{0.475}Li_{0.05})(Nb_{0.92}Ta_{0.05}Sb_{0.03})O_3+0.6$ wt % $CeO_2+0.6$ wt % $MnO_2$; and the like.

In another preferred embodiment of this invention, "B" represents Mn, 0<x≦0.2, and 0<z<1 wt %. That is to say, when using $CeO_2+MnO_2$ as $CeO_2$-containing complex additives, the composition should comprises Sb or Sb+Ta as "A".

The other aspect of the invention provides a method for preparing a piezoelectric ceramic composition, comprising the steps of adding an additive containing Ce and optional B into the compound of general formula $(Na_{0.475}K_{0.475}Li_{0.05})(Nb_{1-x}A_x)O_3$ by the weight percentages giving, and sintering the result to form the composition of formula $(Na_{0.475}K_{0.475}Li_{0.05})(Nb_{1-x}A_x)O_3+yCeO_2+zBO_2$ wherein "A" represents Sb or Sb+Ta, "B" represents a tetravalent transition metal, 0≦x≦0.2, 0.2 wt %<y<1.2 wt %, 0≦z<1 wt %, and said weight percentage y and z are calculated based on the weight of said compound $(Na_{0.475}K_{0.475}Li_{0.05})(Nb_{1-x}A_x)O_3$.

In one embodiment of the process, the compound $(Na_{0.475}K_{0.475}Li_{0.05})(Nb_{1-x}A_x)O_3$ is prepared by mixing a compound containing sodium, a compound containing potassium, compound containing lithium, a compound containing niobium, a optional compound containing tantalum, and an optional compound containing antimony by a stoichiometric ratio giving, and calcining the mixture to get said compound $(Na_{0.475}K_{0.475}Li_{0.05})(Nb_{1-x}A_x)O_3$.

Preferably, the compound containing sodium is $Na_2CO_3$, said compound containing potassium is $K_2CO_3$, said compound containing lithium is $Li_2CO_3$, said compound containing niobium is $Nb_2O_5$, said compound containing tantalum is $Ta_2O_5$ and said compound containing antimony is $Sb_2O_5$ and said additive is $CeO_2$ and optional $BO_2$ "B" is at least one element selected from the group consisting of Mn, Ti and Zr.

In the lead-free piezoelectric composition of the present invention described above, Ce may enter into the crystal structure or exist at the grain boundary. The additives serve to restrict melting and grain growth of $(Na_{0.475}K_{0.475}Li_{0.05})(Nb_{1-x}A_x)O_3$, thereby promoting the sinterability of the perovskite compound at a sintering or firing temperature in a range, in which the amount of volatilization of alkali components is sufficiently small. In particular, partial substitution of Nb by Sb or Sb+Ta reduces the total content of $KNbO_3$ (which has a comparatively low melting point), thereby raising the melting point of the system as a whole, making it possible to raise the sintering temperature to a level at which the volatilization of the alkali components does not matter, so that the sinterability of the perovskite compound can be further improved. Namely, the present lead-free piezoelectric ceramic composition can be well sintered in a wider temperature range and in a normal manner, without employing a special forming and sintering technique such as the hot pressing technique. The thus improved sinterability results in intended densification of the sintered body, which enhances the piezoelectric properties. In particular, the partial substitution of Nb by Sb or Sb+Ta results in a considerable improvement of the dielectric and piezoelectric properties of the sintered body. Thus, the present lead-free piezoelectric ceramic composition exhibits excellent piezoelectric properties and has a high degree of efficiency of preparation or fabrication.

EXAMPLES

The present invention will next be described in detail by way of examples while referring to the drawings, but the examples should not constructed as limiting the invention thereto.

Example I

Starting materials for this example can be $Na_2CO_3$, $K_2CO_3$, $Li_2CO_3$, $Nb_2O_5$ and $CeO_2$.

These materials were weighed to give a composition of $(Na_{0.475}K_{0.475}Li_{0.05})NbO_3$. The thus-weighed materials were wet-milled in a ball mill for about 10 hours, and the resulting mixture dried and then calcined at 800 to 950° C. Then $CeO_2$ in different amounts as shown in Table 1 added into the calcined mixture, and the resulting mixture was wet-milled and dried again.

Each of the thus-dried mixture granulated and added with PVA as a binder. Then, each of the granulated powders was pressed under a pressure of 1000 kg/cm² to obtain circular discs in a diameter of 12 mm and a thickness of 1.4 mm. These discs are sintered at a temperature between 1070 and 1140° C. in the usual manner to obtain sintered ceramic discs.

Figure 2:
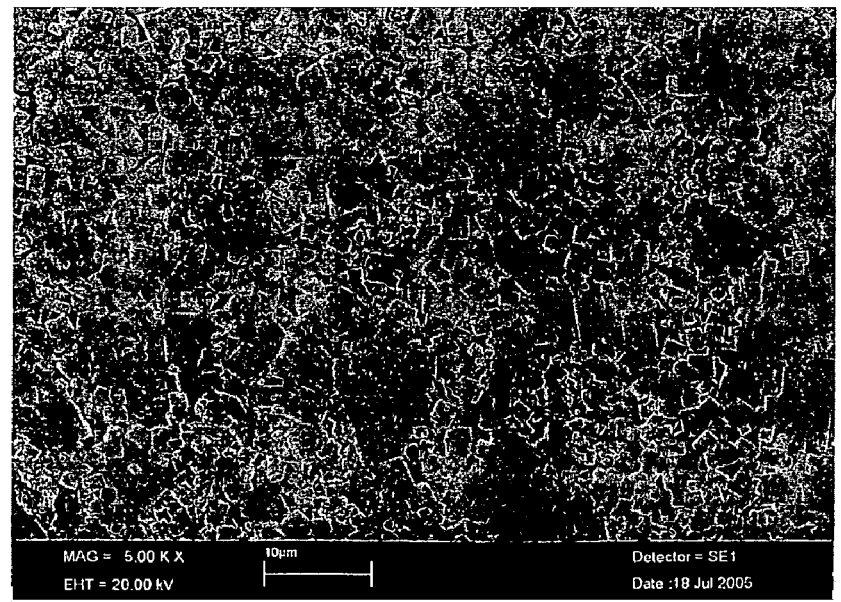
FIG. 2 is a SEM micrograph of the cross section of Sample 3 (the present invention).

A silver paste applied to both surfaces of the sintered ceramic discs and fired to form silver electrodes. Then, they poled under an electric field of 5 kV/mm to 10 kV/mm for 15 to 30 minutes in silicon oil at 130 to 180° C. After poling, a d meter (ZJ-30 PIEZO $d_{33}$ METER) used to measure the $d_{33}$ coefficient at 100 Hz. The resonance measurements performed using an impedance analyzer such as one sold under the brand name by Hewlett-Packard 4294A Impedance Analyzer by Hewlett-Packard, a Delaware Corporation. The electromechanical coupling factor $k_p$ of the vibration in the radial direction was calculated from the resonance and the anti-resonance frequencies according to Onoe's formulas. Dielectric properties were determined using an impedance analyzer such as one sold under the brand name Hewlett-Packard 4192A Impedance Analyzer by Hewlett-Packard at 1 kHz. The data obtained are shown in Tables I-2 and FIGS. 1-2.

TABLE 1

Dielectric and piezoelectric properties of CeO2-added $(Na_{0.475}K_{0.475}Li_{0.05})NbO_3$ ceramics

| Sample No. | Amount of CeO2(wt %) | Sintering condition (° C. zh) | $k_p$ (%) | $d_{33}$ (pC/N) | Dielectric Constant $\epsilon_r$ | Loss tanσ (%) |
|---|---|---|---|---|---|---|
| 1 | 0 | 1080 × 2 | 36 | 141 | 454 | 11.5 |
| 2 | 0.2 | 1090 × 2 | 34 | 132 | 624 | 6.4 |
| 3 | 0.4 | 1090 × 2 | 40 | 148 | 785 | 2.2 |
| 4 | 0.6 | 1110 × 2 | 45 | 198 | 1013 | 2.1 |
| 5 | 0.8 | 1120 × 2 | 42 | 182 | 981 | 1.4 |
| 6 | 1.2 | 1120 × 2 | 35 | 137 | 884 | 2.1 |

TABLE 2

Dielectric and piezoelectric properties of the $(Na_{0.475}K_{0.475}Li_{0.05})NbO_3$ + 0.8 wt % $CeO_2$ composition sintered at 1120° C. for different soaking times.

| Sintering condition | Kp(%) | D33 | Dielectric constant $\epsilon_r$ | Loss tanσ (%) |
|---|---|---|---|---|
| 1120 × 2 | 42 | 182 | 981 | 1.4 |
| 1120 × 10 | 46 | 194 | 1238 | 3.2 |

In Table 1, samples No. 3 to No. 5 are within the scope of the invention. For sample No. 2, there is no significant effect on the sinterability by the addition of 0.2 wt % $CeO_2$, so it is out the scope of the invention. On the other hand, probably due to the formation of too much defects, there is significant decrease in both the dielectric and piezoelectric properties by the addition of 1.2 wt % $CeO_2$, so sample No. 6 is also out the scope of the invention. As shown in Table 1, samples No. 3 to No. 5 show dielectric properties superior to those of sample No. 1 (without addition of $CeO_2$ one of piezoelectrics in the prior art). The addition of $CeO_2$ leads to an increase in sintering temperature and a decrease in grain size (FIGS. 1-2), implying that $CeO_2$ suppresses the grain growth effectively. It is also seen that by the addition of a suitable amount of $CeO_2$ the piezoelectric properties of $(Na_{0.475}K_{0.475}Li_{0.05})NbO_3$ ceramics can be improved.

In addition, as shown in Table 2, a longer soaking time is helpful for improving both the dielectric and piezoelectric properties. However, the temperature range for well-sintering $CeO_2$-added $(Na_{0.475}K_{0.475}Li_{0.05})NbO_3$ composition is still narrow, and their dielectric properties are not good enough and needed to be further improved.

Example 2

In a second example, the starting materials were $Na_2CO_3$, $K_2CO_3$, $Li_2CO_3$, $Nb_2O_5$, $Sb_2O_5$, $Ta_2O_5$, $CeO_2$, and $MnO_2$.

These materials were weighed to give a composition of $(Na_{0.475}K_{0.475}Li_{0.05})(Nb_{1-x}A_x)O_3+yCeO_2+zB$ where x, y and z are as in Table 3 below. These materials were processed in the same manner as in Example 1 to obtain piezoelectric ceramic disc samples.

Measurements were conducted to obtain the relative dielectric constant ($\epsilon_r$) of these disk samples, electromechanical coupling factor k of the vibration in the radius direction, and piezoelectric constant d The data obtained are shown in Tables 3-4.

samples No. 7 and No. 8, but also to samples No. 9 to No. 12. This indicates that the CeO complex additives are more effective in improving the sinterability and dielectric and piezoelectric properties of the composition than the $CeO_2$ additive.

Likewise, as comparing the dielectric and piezoelectric properties of samples No. 19 to No. 22, it can be seen that the $CeO_2$ and $CeO_2$-containing complex additives have similar effects on the $(Na_{0.475}K_{0.475}Li_{0.05})(Nb_{1-x}Sb_x)O_3$ composition. In particular, as shown in Table 4, the $CeO_2$-containing complex additives can also improve the sintering temperature range for the composition.

Figure 3:
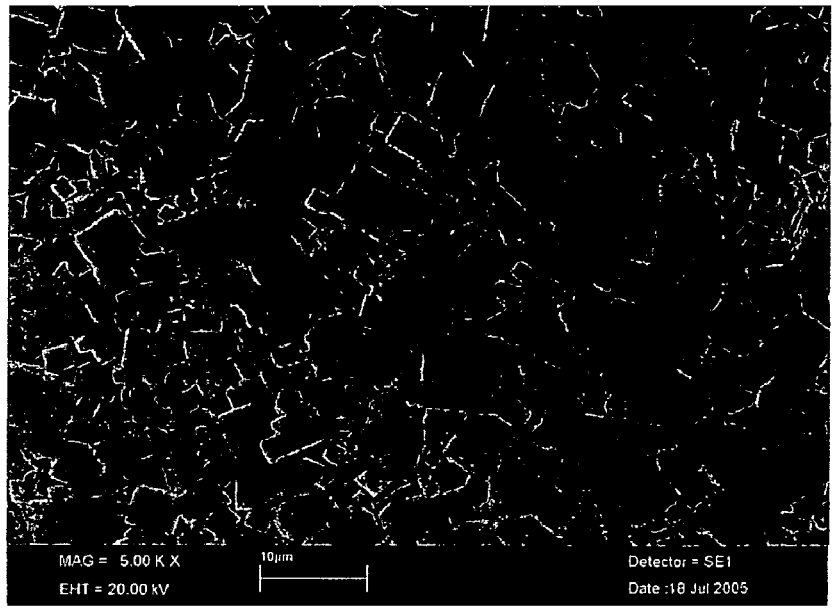
FIG. 3 is a SEM micrograph of the cross section of Sample 19 (comparative sample)
Figure 4:
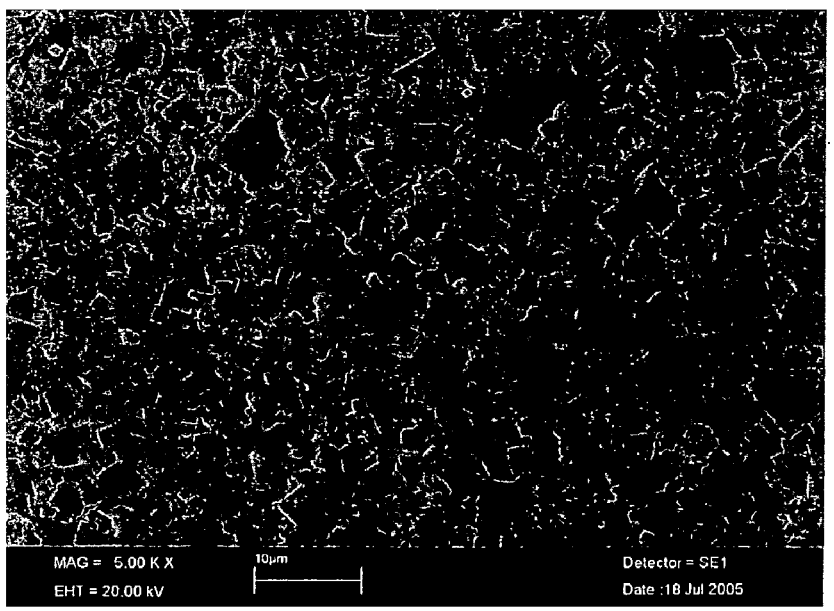
FIG. 4 is a SEM micrograph of the cross section of Sample 21 (the present invention).

Similar to the cases in Example 1, addition of the $CeO_2$ complex additives can suppress the grain growth effectively (see FIGS. 3-4).

TABLE 3

Dielectric and piezoelectric properties of the composition
$(Na_{0.475}K_{0.475}Li_{0.05})(Nb_{1-x}A_x)O_3 + yCeO_2 + zBO_2$

| Sample No. | A | B | x | y (wt %) | z (wt %) | Sintering condition (° C. × h) | $k_p$ (%) | $d_{33}$ (pC/N) | Dielectric constant $\epsilon_r$ | Loss tanδ (%) |
|---|---|---|---|---|---|---|---|---|---|---|
| 7 | Sb | — | 0.01 | 0 | 0 | 1070 × 2 | 29 | 131 | 522 | 2.0 |
| 8 | Sb | — | 0.03 | 0 | 0 | 1080 × 2 | 37 | 147 | 686 | 6.3 |
| 9 | Sb | — | 0.01 | 0.4 | 0 | 1110 × 2 | 40 | 151 | 822 | 3.5 |
| 10 | Sb | — | 0.01 | 0.8 | 0 | 1120 × 2 | 41 | 164 | 990 | 2.2 |
| 11 | Sb | — | 0.03 | 0.4 | 0 | 1100 × 2 | 38 | 155 | 702 | 6.4 |
| 12 | Sb | — | 0.03 | 0.8 | 0 | 1110 × 2 | 42 | 174 | 1014 | 4.5 |
| 13 | Sb | Mn | 0.03 | 0.4 | 0.4 | 1100 × 2 | 43 | 184 | 890 | 3.0 |
| 14 | Sb | Mn | 0.03 | 0.6 | 0.6 | 1120 × 2 | 42 | 193 | 1047 | 2.2 |
| 15 | Sb | Ti | 0.03 | 0.4 | 0.4 | 1100 × 2 | 43 | 187 | 985 | 2.7 |
| 16 | Sb | Ti | 0.03 | 0.6 | 0.6 | 1100 × 2 | 40 | 171 | 936 | 3.1 |
| 17 | Sb | Zr | 0.03 | 0.4 | 0.4 | 1100 × 2 | 42 | 196 | 1093 | 2.5 |
| 18 | Sb | Zr | 0.03 | 0.6 | 0.6 | 1100 × 2 | 41 | 180 | 1016 | 2.3 |
| 19 | Sb + Ta | — | 0.03 + 0.05 | 0 | 0 | 1080 × 2 | 45 | 207 | 1166 | 2.1 |
| 20 | Sb + Ta | — | 0.03 + 0.05 | 0.4 | 0 | 1090 × 2 | 45 | 211 | 1175 | 2.2 |
| 21 | Sb + Ta | Mn | 0.03 + 0.05 | 0.4 | 0.4 | 1100 × 2 | 45 | 223 | 1223 | 1.8 |
| 22 | Sb + Ta | Mn | 0.03 + 0.05 | 0.6 | 0.6 | 1110 × 2 | 43 | 197 | 1114 | 2.1 |

TABLE 4

Dielectric and piezoelectric properties of the composition sintered at different temperatures
$(Na_{0.475}K_{0.475}Li_{0.05})(Nb_{0.92}Ta_{0.05}Sb_{0.03})O_3 + 0.4$ wt % $CeO_2 + 0.4$ wt % $MnO_2$

| Sintering condition (° C. × h) | $k_p$ (%) | $d_{33}$ (pC/N) | Dielectric constant $\epsilon_r$ | Loss tanδ (%) | Density ρ (g/cm³) |
|---|---|---|---|---|---|
| 1090 × 2 | 44 | 207 | 1091 | 2.1 | 4.38 |
| 1100 × 2 | 45 | 223 | 1223 | 1.8 | 4.49 |
| 1110 × 2 | 45 | 214 | 1204 | 1.9 | 4.46 |
| 1120 × 2 | 44 | 216 | 1239 | 1.8 | 4.41 |

In Table 3, samples No. 9 to No. 18 and samples No. 20 to No. 22 are within the scope of the invention.

As shown in Table 3, samples No. 9 to No. 12 all have dielectric and piezoelectric properties superior to those of samples No. 7 to No. 8 (without addition of additives), which are the conventional ceramics $(Na_{0.475}K_{0.475}Li_{0.05})(Nb_{1-x}Sb_x)O_3$. This clearly shows the effects of $CeO_2$ to improve the dielectric and piezoelectric properties of the composition. It can also be seen that samples No. 13 to No. 18 have dielectric and piezoelectric properties superior not only to those of It has been confirmed that the total amount of the additives is defined to be not larger than about 3% by weight. Preferably the amount is less than 2%.

It has been found that $MnO_2$ functions well together with $CeO_2$ in the composition containing Sb such as samples No. 13, No. 14, No. 21 and No. 22. In fact, addition of $MnO_2$ in the $(Na_{0.475}K_{0.475}Li_{0.05})(Nb_{1-x}A_x)O_3$ composition with no Sb does not raise or even lower the sintering temperature and decrease the electric properties. From this, it is understood that the effect of $MnO_2$ may concern with the existence of Sb in the $(Na_{0.475}K_{0.475}Li_{0.05})(Nb_{1-x}A_x)O_3$ composition, which is within the scope of the invention.

While the invention has been described with reference to specific embodiments chosen for purpose of illustration, it should be apparent that numerous modifications could be made thereto by those skilled in the art without departing from the basic concept and scope of the invention. Such variations are intended to be within the scope of the present invention.

What is claimed is:

1. A piezoelectric ceramic composition represented by the following formula:

$(Na_{0.475}K_{0.475}Li_{0.05})(Nb_{1-x}A_x)O_3+yCeO_2+zBO_2$; 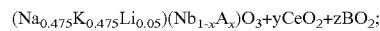

wherein "A" represents Sb or Sb+Ta,

"B" represents a tetravalent transition metal, $0 \leq x \leq 0.2$, 0.2 wt % < y < 1.2 wt %, and 0.4 wt % $\leq z \leq$ 0.6 wt %, said weight percentage y and z are calculated based on the weight of said compound $(Na_{0.475}K_{0.475}Li_{0.05})(Nb_{1-x}A_x)O_3$.

2. A piezoelectric ceramic composition, represented by the following formula:

$$(Na_{0.475}K_{0.475}Li_{0.05})(Nb_{1-x}A_x)O_3+yCeO_2+zBO_2;$$

wherein "A" represents Sb or Sb+Ta, $0<x \leq 0.2$, 0.2 wt % < y < 1.2 wt %, and 0 < z < 1 wt %, said weight percentage y and z are calculated based on the weight of said compound $(Na_{0.475}K_{0.475}Li_{0.05})(Nb_{1-x}A_x)O_3$.

3. A piezoelectric ceramic composition according to claim 1, wherein "B" is at least one element selected from the group consisting of Mn, Ti and Zr.

4. A piezoelectric ceramic composition according to claim 1 or 3, wherein 0.4 wt % $\leq y \leq$ 0.8 wt %.

5. A piezoelectric ceramic composition according to claim 4, wherein $0<x \leq 0.08$.

6. A piezoelectric ceramic composition according to claims 1 or 2, wherein said piezoelectric ceramic composition is selected from the list of:

$(Na_{0.475}K_{0.475}Li_{0.05})(Nb_{0.97}Sb_{0.03})O_3$+0.4 wt % $CeO_2$+ 0.4 wt % $MnO_2$;

$(Na_{0.475}K_{0.475}Li_{0.05})(Nb_{0.97}Sb_{0.03})O_3$+0.6 wt % $CeO_2$+ 0.6 wt % $MnO_2$;

$(Na_{0.475}K_{0.475}Li_{0.05})(Nb_{0.97}Sb_{0.03})O_3$+0.4 wt % $CeO_2$+ 0.4 wt % $TiO_2$;

$(Na_{0.475}K_{0.475}Li_{0.05})(Nb_{0.97}Sb_{0.03})O_3$+0.6 wt % $CeO_2$+ 0.6 wt % $TiO_2$;

$(Na_{0.475}K_{0.475}Li_{0.05})(Nb_{0.97}Sb_{0.03})O_3$+0.4 wt % $CeO_2$+ 0.4 wt % $ZrO_2$;

$(Na_{0.475}K_{0.475}Li_{0.05})(Nb_{0.97}Sb_{0.03})O_3$+0.6 wt % $CeO_2$+ 0.6 wt % $ZrO_2$;

$(Na_{0.475}K_{0.475}Li_{0.05})(Nb_{0.92}Ta_{0.05}Sb_{0.03})O_3$+0.4 wt % $CeO_2$+0.4 wt % $MnO_2$; and $(Na_{0.475}K_{0.475}Li_{0.05})(Nb_{0.92}Ta_{0.05}Sb_{0.03})O_3$+0.6 wt % $CeO_2$+0.6 wt % $MnO_2$.

7. A method for preparing a piezoelectric ceramic composition, comprising the steps of:

adding an additive containing Ce and optional B into the compound of general formula $(Na_{0.475}K_{0.475}Li_{0.05})(Nb_{1-x}A_x)O_3$ by the weight percentages giving, and sintering the result to form the composition of formula $(Na_{0.475}K_{0.475}Li_{0.05})(Nb_{1-x}A_x)O_3+yCeO_2+zBO_2$, wherein "A" represents Sb or Sb+Ta, "B" represents a tetravalent transition metal, $0 \leq x \leq 0.2$, 0.2 wt % < y < 1.2 wt %, and 0.4 wt % $\leq z \leq$ 0.6 wt %, said weight percentage y and z are calculated based on the weight of said compound $(Na_{0.475}K_{0.475}Li_{0.05})(Nb_{1-x}A_x)O_3$.

8. A method according to claim 7, wherein said compound $(Na_{0.475}K_{0.475}Li_{0.05})(Nb_{1-x}A_x)O_3$ is prepared by:

mixing a compound containing sodium, a compound containing potassium, a compound containing lithium, a compound containing niobium, a optional compound containing tantalum, and a optional compound containing antimony by a stoichiometric ratio giving, and calcining the mixture to get said compound $(Na_{0.475}K_{0.475}Li_{0.05})(Nb_{1-x}A_x)O_3$.

9. A method according to claim 8, wherein said compound containing sodium is $Na_2CO_3$, said compound containing potassium is $K_2CO_3$, said compound containing lithium is $Li_2CO_3$, said compound containing niobium is $Nb_2O_5$, said compound containing tantalum is $Ta_2O_5$, and said compound containing antimony is $Sb_2O_5$ and said additive is $CeO_2$ and optional $BO_2$, "B" is at least one element selected from the group consisting of Mn, Ti and Zr.

* * * * *